United States Patent [19]

Castaldi et al.

[11] Patent Number: 5,296,334

[45] Date of Patent: Mar. 22, 1994

[54] RADIATION-CURABLE COMPOSITION USEFUL FOR PREPARATION OF SOLDER MASKS

[75] Inventors: Steven A. Castaldi, Torrington; Peter D. Gabriele, Bristol; Victor Saverino, Southington, all of Conn.

[73] Assignee: MacDermid, Incorporated, Waterbury, Conn.

[21] Appl. No.: 938,029

[22] Filed: Aug. 28, 1992

[51] Int. Cl.$^5$ .............................................. G03C 1/725
[52] U.S. Cl. ................................... 430/280; 430/311; 430/325; 430/330
[58] Field of Search ............... 430/311, 280, 325, 330; 522/120, 101

[56] References Cited

U.S. PATENT DOCUMENTS

| | | | |
|---|---|---|---|
| 4,722,947 | 2/1988 | Thanawalla et al. | 522/120 |
| 4,745,138 | 5/1988 | Thanawalla et al. | 522/120 |
| 5,114,830 | 5/1992 | Surber | 430/280 |

FOREIGN PATENT DOCUMENTS 11930  1/1988  Japan .

Primary Examiner—Marion E. McCamish
Assistant Examiner—Mark A. Chapman
Attorney, Agent, or Firm—St. Onge Steward Johnston & Reens

[57] ABSTRACT

A photosensitive composition for providing a solder mask on a printed circuit board is described, comprised of (a) an esterified styrene-maleic anhydride copolymer having less than 15%, most preferably less than 5%, free anhydride, with at least about 50% of the available anhydride groups being esterified with a hydroxyalkyl (meth)acrylate and at least about 0.1% of the available anhydride groups being esterified with a monohydric alcohol; (b) a multifunctional (meth)acrylate monomer; and (c) a multifunctional epoxide. The composition is coated on a printed circuit board, imagewise exposed to radiation to effect sufficient curing of the composition at exposed areas to enable removal of unexposed areas with developer, and post-baked after development to produce a desired patterned distribution of the cured composition to serve as a solder mask.

20 Claims, No Drawings

RADIATION-CURABLE COMPOSITION USEFUL FOR PREPARATION OF SOLDER MASKS

BACKGROUND OF THE INVENTION

The present invention relates to radiation-curable compositions which can be used to provide solder masks in connection with printed circuit fabrication techniques, and also relates to methods for producing a cured solder mask.

As is well known in the art of printed circuit fabrication, solder masks are employed so as to prevent all but selected areas of the printed circuit (e.g., all areas other than through-holes and their surrounding pads, surface mount areas, etc.) from coming into contact with molten solder during provision of solder to these selected areas and during solder connection of various electronic components to the printed circuit at these selected areas.

Based upon considerations of ease of application and ability to obtain the fine definition usually required in most printed circuits, the most desirable solder masks are those formed from photosensitive resin compositions, i.e., compositions of organic resin materials which undergo polymerization (curing, crosslinking) under influence of radiation exposure. Typically, a layer of the photosensitive composition is deposited over the printed circuit board, heated (prebaked) to drive off a substantial portion of the solvent carrier for the composition, and then exposed to radiation of appropriate energy in a selective manner such that exposure occurs only at those areas where the solder mask is desired. The exposure brings about at least partial curing of the resin composition at such areas, rendering it there differentially less soluble (relative to a suitable developer) than at areas where the composition was not exposed. As such, unexposed composition can be selectively removed from the printed circuit board using the developer, leaving behind a distribution of the at least partially cured resin composition in the desired solder mask pattern. Suitable post-development steps, such as further radiation exposure and/or heating (postbaking) of the patterned composition, typically are then employed to effect further curing of the composition as may be needed in order for it to serve as an effective solder mask.

To best serve their intended purpose, solder masks should exhibit a high degree of chemical resistance to solder and the fluxes used in soldering operations, and a high degree of thermal resistance relative to the elevated temperatures used in soldering operations. Many solder masks produced from photosensitive resin compositions are deficient in these regards, having tendencies to degrade, blister or separate from the circuit board under conditions of soldering applications. Yet other photosensitive resin compositions produce solder masks which are excessively brittle, with increased tendency to chipping and flaking under conditions normally encountered in handling and processing of the circuit boards on which they are arranged. Attempts at solving these problems often tend to be counter-productive, i.e., generating problems associated with the resin composition itself, such as premature curing, instability, short shelf life, and the like.

The formulation of a suitable photosensitive resin composition for production of a solder mask thus involves a careful balancing of factors, often seemingly inconsistent, so as to attain desirable properties in the composition itself and in a solder mask produced from it.

SUMMARY OF THE INVENTION

In accordance with the present invention, there is provided a photosensitive (i.e., radiation-curable) resin composition for producing a solder mask in the environment of printed circuit fabrication. The radiation-curable composition comprises as its essential components (a) a styrene-maleic anhydride copolymer, in which a high percentage of the available anhydride groups thereof are esterified with a hydroxyalkyl (meth)acrylate and/or a monohydric alcohol, such that the esterified copolymer contains a minimal proportion of free anhydride groups, with the proviso that at least 50% of the available anhydride groups are esterified with the hydroxyalkyl (meth)acrylate and at least 0.1% of the available anhydride groups are esterified with the monohydric alcohol; (b) a multifunctional (meth)acrylate monomer; and (c) a multifunctional epoxide. Typically, the composition also will include a photoinitiator, as well as a variety of other additive materials known for use in photosensitive resin compositions for production of solder masks, such as pigments and dyes, sensitizers, flow promoting agents and the like. Yet further, the composition will typically include an inert liquid carrier or diluent as may be needed to enable it to be coated as a uniform layer.

In the process of the invention, the foregoing composition is coated onto a printed circuit board at the stage of printed circuit fabrication where it is desired to mask selected board areas for subsequent soldering steps. The so-applied coating typically will then be dried in a prebaking step, and then be imagewise exposed to actinic radiation in the desired solder mask pattern to effect imagewise curing and cross-linking of the composition. Unexposed composition is then removed in a suitable developer, and the remaining distribution of cured composition is then further treated by, at the least, baking at elevated temperature to effect further curing of the composition to the degree needed for it to serve as a suitable solder mask.

Exposure of the coated composition to actinic radiation of suitable energy results in reaction between (meth)acrylate groups on the copolymer and (meth)acrylate groups of the multifunctional (meth)acrylate monomer to effect cross-linking to a degree at least sufficient to render exposed composition areas differentially less soluble in developer than unexposed areas. After development, it generally will be desirable to effect yet further radiation-induced curing of the patterned composition, i.e., yet further radiation-induced cross-linking between the above-noted (meth)acrylate groups, by additional exposure of the now-patterned composition to actinic radiation. Additionally, a postbaking step is employed at conditions effective to bring about yet further curing of the composition, primarily by virtue of thermally-induced cross-linking involving the multifunctional epoxide component of the composition. In these thermally-induced reactions, epoxide groups may cross-link with each other and/or with free anhydride groups remaining on the esterified styrene-maleic anhydride copolymer and/or with other components present in the composition (e.g., free carboxylic acids) for such purpose.

Important characteristics of the composition of the invention, and solder masks produced therefrom, include the low content of free anhydride groups present in the styrene-maleic anhydride copolymer/hydroxyalkyl (meth)acrylate/monohydric alcohol esterification reaction product. This characteristic, which is attainable because the esterification reaction employing hydroxyalkyl (meth)acrylate and monohydric alcohol is more driven to completion than simple esterification using solely hydroxyalkyl (meth)acrylate, has a number of important benefits. In particular, the low content of free anhydride groups substantially minimizes premature cross-linking reaction between such groups and epoxide groups of the multifunctional epoxide, as may occur during drying (pre-baking) of the composition. If too substantial, as would be the case if too great a number of intact anhydride groups were present, such premature cross-linking renders subsequent exposure/development substantially more difficult if not impossible. With the tendency for premature cross-linking minimized, the invention provides far more latitude for pre-baking conditions than otherwise would be possible.

In addition, the low content of free anhydride groups greatly extends the useful shelf life of the composition. Whether in compositions in which the esterified styrene-maleic anhydride copolymer and the multifunctional epoxide are present together, or even in compositions formulated in distinct parts so as to initially separate these components until admixed for use, compositions or parts thereof containing the esterified copolymer will, if the free anhydride content thereof is too high, exhibit rapid and substantial increase in viscosity under normal shipping and storage conditions, to the point where the composition or part rapidly becomes unusable. With the compositions of the invention, in which the esterified styrene-maleic anhydride copolymer has a very low proportion of free anhydride groups, the composition (or part thereof containing the copolymer) remains commercially usable for extended periods.

As noted, the use of monohydric alcohol along with the hydroxyalkyl (meth)acrylate for esterifying the styrene-maleic anhydride copolymer drives the esterification reaction more towards completion than generally is possible using hydroxyalkyl (meth)acrylate alone, with the attendant benefits associated with minimizing free anhydride groups. In addition, the esterification of at least some of the anhydride groups with the monohydric alcohol establishes, in the esterified copolymer, structural units which serve as an internal plasticizer in the composition per se and, importantly, in the solder masks produced therefrom by exposure, development and post-development processing. As such, the solder masks produced from the composition of the invention possess exceptional internal flexibility and are thus highly resistant to the problematic cracking and flaking otherwise associated with solder masks which are inherently brittle in their state of use.

DETAILED DESCRIPTION OF THE INVENTION

In the compositions of the present invention, an essential component is an esterified styrene-maleic anhydride copolymer. To prepare this component, styrene-maleic anhydride copolymer, generally having a number average molecular weight of from about 500 to about 4000 and a mole ratio of styrene to maleic anhydride of from about 1:1 to about 4:1, is reacted in known manner with hydroxyalkyl (meth)acrylate and monohydric alcohol, either sequentially or with a mixture of the esterifying components. More preferred styrene-maleic anhydride copolymers are those having a number average molecular weight in the range of from about 1000 to about 3000. Copolymers of this type are commercially available, e.g., under the tradename "SMA Resins" from the Atochem Chemical Company.

The hydroxyalkyl (meth)acrylate utilized in the esterification reaction can be, for example, hydroxyethyl acrylate or methacrylate, hydroxypropyl acrylate or methacrylate, hydroxybutyl methacrylate, tetrapropylene glycol monoacrylate or monomethacrylate or the like, corresponding to the formula

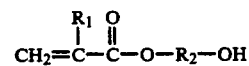

in which $R_1$ is hydrogen or methyl, and $R_2$ is a linear or branched divalent alkylene of from about 1 to 6 carbon atoms, or an oxyalkylated derivative thereof. Mixtures of hydroxyalkyl (meth)acrylates may also be employed.

The monohydric alcohol utilized in the esterification reaction typically will be an aliphatic or arylalkyl monohydric alcohol, such as methanol, ethanol, propanol, butanol, 1-methoxy-2-propanol, and the like. Mixtures of monohydric alcohols may also be employed.

For forming the esterification product, the styrene-maleic anhydride copolymer may be first reacted with the hydroxyalkyl (meth)acrylate or with the monohydric alcohol, and thereafter with the other, but preferably the reaction is effected using an admixture of hydroxylakyl (meth)acrylate and monohydric alcohol in reactant ratios as necessary to achieve the requisite proportion between them of esterification of the anhydride groups of the copolymer.

Details regarding the esterification reaction conditions can be found, e.g., in U.S. Pat. Nos. 4,745,138 and 4,722,947, incorporated herein by reference.

The esterification reaction is carried out to a degree such that the reaction product contains less than 15%, more preferably less than 10%, and most preferably less than 5%, of "free" anhydride groups, i.e., intact as anhydride groups per se.

In addition to the foregoing criterion regarding the minimal free anhydride content, the esterification reaction, whether carried out sequentially or with admixture of (meth)acrylate and alcohol, is controlled so as to provide a copolymer in which at least 50%, more preferably at least about 60% and most preferably at least about 85%, of the available anhydride groups are esterified with the hydroxyalkyl (meth)acrylate, and in which at least about 0.1%, more preferably at least about 5% and most preferably at least about 10%, of such anhydride groups are esterified with the monohydric alcohol. In this manner, the esterified copolymer contains a sufficient degree of hydroxyalkyl (meth)acrylate groups for undergoing the radiation-induced cross-linking with multifunctional (meth)acrylate monomer to the extent required to cure the composition to enable selective development and to provide the structure necessary to serve as a suitable solder mask, while at the same time containing a sufficient degree of anhydride groups esterified with monohydric alcohol to provide the internal plasticization which leads to the outstanding internal flexibility of solder masks made from the composition of the invention.

Generally speaking, those maleic anhydride groups of the copolymer which undergo esterification do so in a manner whereby only one of either the hydroxyalkyl (meth)acrylate or the monohydric alcohol moieties esterifies therewith, i.e., producing structural units corresponding either to

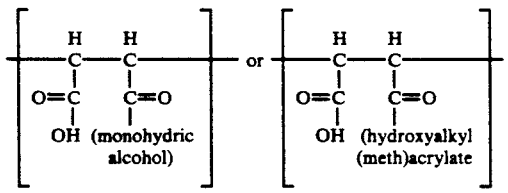

Owing to the relatively small size and the structure of certain monohydric alcohols, however, possibilities also exist for the formation of structural units corresponding either to

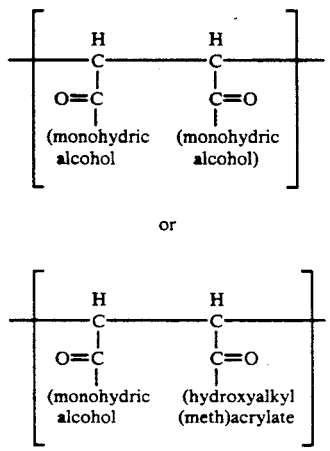

The latter structural units can be of particular advantage in that it becomes possible to introduce the desired monohydric alcohol as an internal plasticizer while at the same time preserving a high content of hydroxyalkyl (meth)acrylate for engaging in radiation-initiated crosslinking with the multifunctional (meth)acrylate monomer present in the composition.

Another essential component of the composition of the invention is the reactive multifunctional (meth)acrylate monomer, i.e., a monomer containing two or more reactive (meth)acrylate groups, capable of undergoing radiation-induced reaction (typically in the presence of a photoinitiator) with the (meth)acrylate groups on the copolymer to effect cross-linking. The reactive multifunctional (meth)acrylate monomer may include, alone or in mixture, any of the well known such compounds, including polyol polyacrylates and polymethacrylates, such as 1,6-hexane diol diacrylate, neopentyl glycol diacrylate, trimethylol propane triacrylate, 1,3-butylene glycol diacrylate, tetraethylene glycol diacrylate, and acrylate esters of bisphenol-A based epoxies. The choice of any particular such compound or mixtures thereof will be largely dictated by reactivity for the (meth)acrylate groups on the esterified styrenemaleic anhydride copolymer, desired viscosity properties, and the like.

Another essential component of the inventive composition is a multifunctional epoxide, i.e., any diepoxide, triepoxide or epoxide of greater functionality, or mixture of them, which is capable of undergoing thermally-induced cross-linking reaction, whether with itself or with free anhydride groups of the copolymer or with other agents, as well known in the art, which thermally cross-link with epoxide groups, such as free carboxylic acids. Suitable such multifunctional epoxides include the epoxy novolac resins, such as epoxy cresylic novolac resins, epoxidized phenolic novolac resins, and the like.

In at least the preferred embodiments of the invention, the composition will further include a photoinitiator for initiating the radiation-induced crosslinking of (meth)acrylate groups of the esterified copolymer and the multifunctional (meth)acrylate monomer. For this purpose, any radiation-responsive free-radical generating compound known in the art can be employed, such as the UV-responsive photoinitiators 2,2-dimethoxy-2-phenyl-acetophenone, 2-hydroxy-2-methyl-1-phenyl propanone, benzoin, benzoin methyl ether, benzil, benzophenone, acetophenone, 2-methyl-1-[4-(methyl thio) phenyl]-2-morpholino-propanone-1, isopropyl thioxanthone, and the like.

In addition to the foregoing components, the composition of the invention may contain a wide variety of functional additives, such as the earlier-mentioned agents for thermal cross-linking with epoxide groups of the multifunctional epoxide, flow promoting agents, visible radiation absorbing agents, carboxyl functional acrylic copolymers, air release agents, pigments and dyes, sensitizers, viscosity control agents or modifiers, filler/extender pigments, monofunctional radiation-curable monomers, cationic initiating monomers, and the like.

Inasmuch as the composition of the invention is intended to be coated as a substantially uniform thin layer on a printed circuit board substrate, it generally will be desirable to provide the composition components in dilution with an appropriate inert liquid carrier or solvent. In terms of the composition at the time of application to the printed circuit board, the composition typically will contain from about 5 to about 50% by weight of the esterified styrene-maleic anhydride copolymer, more preferably from about 10 to about 30% by weight; from about 5 to about 20% by weight of the multifunctional (meth)acrylate monomer component, more preferably from about 7.5 to about 15% by weight; and from about 1 to about 30% by weight, more preferably from about 5 to about 20% by weight, of the multifunctional epoxide. When a photoinitiator is employed, it typically will be present in an amount of from about 1 to about 15% by weight. The weight percents given above are relative to the total weight of the composition, including other additives, diluents or solvents as may be present.

For most commercial purposes, the composition of the invention will be provided as a two part system for admixture just prior to use, in which, at the least, the multifunctional epoxide and the esterified styrene-maleic anhydride copolymer are contained in different parts so as to prevent premature thermally-induced reaction between the two, i.e., between the reactive epoxide groups and any free anhydride groups on the copolymer, as might occur under some conditions of shipping or storage. One consequence of the present invention, in its utilization of highly esterified styrene-maleic anhydride copolymer with a minimum of free anhydride groups, is that the concern for, and effect of, this premature reaction possibility is not as pronounced as with other known systems, and indeed the overall composition undergoes far less increase in viscosity over time, under typical shipping and storage conditions, than is the case for known compositions. Nevertheless, it is still good practice to maintain the epoxide and copolymer separate for as long as possible before use. Even in this regard there is substantial benefit achieved by the invention; for reasons not entirely understood, the shelf life of that part of the composition containing the esterified styrene-maleic anhydride copolymer, without the presence of the epoxide component, is far superior to that found in known two-part compositions for the part containing styrene-maleic anhydride esterified to lesser degree than specified herein and/or esterified solely with hydroxyalkyl (meth)acrylate.

For use of the composition of the invention to provide a solder mask, the provision of a thin (e.g., from about 0.5 to about 5.0 mils, as dried) coating layer thereof onto a printed circuit board can be effected by any known means, such as screen coating, curtain coating, roller coating or the like. Pre-baking (drying) of the so-applied layer is carried out at temperatures in the range of from about 120° to about 170° F. for the time needed. As noted, an important advantage of the composition of the invention appears at this pre-bake stage. In prior art compositions, the free anhydride groups of the copolymer may well engage in extensive cross-linking reaction with epoxide groups of the multifunctional epoxide component of the composition unless the pre-baking temperature and time conditions are very carefully controlled and limited. Should extensive cross-linking occur, the composition becomes difficult, if not impossible, to process by exposure/development as a means of leaving behind the desired imagewise distribution of solder mask, and thus the operating window of suitable pre-bake conditions is exceedingly narrow. With the compositions of the invention, the number of free anhydride sites where cross-linking with epoxide groups might occur during pre-baking are quite few, such that even if cross-linking occurs, the extent of it is not so great as to substantially affect or prevent subsequent exposure/development processing. As such, the operating window of pre-bake conditions is substantially wider, with attendant benefit in speed of operations and a more foolproof process.

For exposure of the layered composition, any suitable high energy radiation can be employed, such as electron beam or ultraviolet light, with selective exposure being effected through a suitably patterned phototool in contact with the coated, dried composition, or alternatively in an off-contact exposure method as known in the art. Removal of unexposed composition is effected using a suitable developer, typically an aqueous alkaline solution (e.g., dilute potassium carbonate) for the compositions of this invention, via brushing, spraying or other technique.

Following development, the remaining imagewise distribution of at least partially cured composition will preferably be further exposed to actinic radiation to effect further free-radical curing of the photopolymer, and then post-baked to effect further thermal curing, particularly that involving the epoxide groups of the multifunctional epoxide as earlier noted, so as to provide a solder mask of requisite properties. Typical post-bake conditions involve temperatures in the range of from about 250° to about 320° F., and times on the order of 5 minutes to 2 hours, using, e.g., a convection oven or IR oven. In the course of the post-baking process, reaction is encouraged to occur between the multifunctional epoxide and e.g., itself and/or any free anhydride groups of the esterified styrene-maleic anhydride copolymer and/or any other suitable components present in the composition.

The solder mask so provided is particularly characterized by its flexibility and resistance to chipping, flaking or loss of adhesion to the underlying areas of the printed circuit in subsequent handling and fabrication steps, and thus provides a mask of excellent integrity for preventing the areas over which it is arranged from coming into contact with solder.

The invention and its advantages are further illustrated in the following examples.

EXAMPLE I

A radiation curable solder mask composition was prepared in two parts as follows:

| | Percent By Weight |
|---|---|
| Component A | |
| Esterified styrene-maleic anhydride copolymer[1] | 25.0 |
| Carboxylated acrylic copolymer[2] | 15.0 |
| Multifunctional (meth)acrylate[3] | 7.5 |
| Photoinitiator[4] | 10.0 |
| Pigment | 4.0 |
| Flow promoter | 3.5 |
| Anti-abrasion agent | 3.5 |
| Air release agent | 3.5 |
| Filler | 17.5 |
| Inert diluent | 10.5 |
| Component B | |
| Multifunctional (meth)acrylate[3] | 25.0 |
| Multifunctional epoxy[5] | 30.0 |
| Thermal cross-linking agent[6] | 7.5 |
| Pigment/filler | 12.5 |
| Inert diluent | 25.0 |

[1] Pro 1100, Sartomer Co., Exton, Pa.
[2] Carboset XPD-1042, B.F. Goodrich Co.
[3] SR 351, Sartomer Co.
[4] Irgacure 907, Ciba-Geigy Co. (Additives Division)
[5] ECN-1299, Ciba-Geigy Co. (Resin Division)
[6] Dyhard-100S, SKW Inc.

Component A and Component B were mixed, in a ratio of 3:1 at room temperature, and the composition so produced was screen-printed onto printed circuit boards using a 70 Durometer squeegee. The boards were then heat treated at 160° F. for various lengths of time to determine the operating window for pre-baking. The pre-baked boards were then subjected to development using a 10 g/l solution of potassium carbonate at 25°–30° C. for 40 seconds. Boards baked for 50 minutes or less exhibited clean removal of the composition, but boards baked at times in excess of 50 minutes exhibited a residual scum of material remaining on the board after development, indicating that premature cross-linking had occurred during the pre-bake.

Additional printed circuit boards were coated with the composition in the same manner as above, the composition dried at 70° C. for twenty minutes, cooled to room temperature, and then identically processed to coat the other side of the board (70° C. drying for 40 minutes). Negatives were brought into contact with the coatings, and each coating then subjected to 400 millijoules of ultraviolet radiation. The coatings were developed using potassium carbonate solution, 25°–30° C.

for 40 seconds. The remaining imagewise distribution of photopolymer was then given a post-exposure of 2-4 joules, and then baked for 1 hour at 150° C.

The so-treated coating was tested for flexibility using the cross-hatch razor technique in which several intersecting lines are cut into the coating. The coating was found to be extremely brittle, with total loss of adhesion at scratched areas.

For determining the shelf life of the Component A mixture, Component A was held at 120° F. for 28 days. The initial viscosity of Component A, 26,400 cps, increased to 48,800 cps by the end of the 28-day period.

EXAMPLE II

Components A and B were identically prepared as set forth in Example I, with the exception of substituting, for the esterified styrene-maleic anhydride copolymer of Example I, a copolymer prepared by esterifying the styrene-maleic anhydride copolymer (identical to that used in obtaining the esterified product of Example I) with a mixture of 2-hydroxyethyl methacrylate (identical to that used in obtaining the esterified product of Example I) and 1-methoxy-2-propanol (mole ratio of about 0.75-1.0). The so-prepared product had about 95% of its available anhydride groups esterified, with about 85% of them esterified with the 2-hydroxyethyl methacrylate and about 10% of them esterified with the 1-methoxy-2-propanol.

As in Example I, the two components were mixed at a 3:1 ratio, and the composition coated on a number of printed circuit boards which were then pre-baked at 160° F. for varying lengths of time. In contrast to the results of Example I, boards pre-baked even in excess of 60 minutes developed cleanly in the noted developer, indicating absence of detrimental cross-linking reaction during pre-baking.

Also using the identical procedure of Example I, coated boards were pre-baked, exposed, developed, post-exposed and post-baked. Using the cross-hatch method, the imagewise distribution of cured coating so-obtained was found to be extremely flexible, with the coating remaining fully intact and adhered to the board after repeated testing.

In shelf-life testing, the initial 26,400 cps viscosity of the Component A of this Example was found to have increased to only 37,200 cps after 28 days of storage at 120° F.

It is to be understood that the foregoing description and examples are provided in illustration of the invention and particular preferred embodiments thereof, and are not intended as limitations upon the scope of the invention except as may be set forth in the appended claims.

What is claimed is:

1. A radiation-curable composition comprising (a) an esterified styrene-maleic anhydride copolymer having less than 15% free anhydride, and in which at least about 50% of the available anhydride groups are esterified with a hydroxyalkyl (meth)acrylate and at least about 0.1% of the available anhydride groups are esterified with a monohydric alcohol; (b) a multifunctional (meth)acrylate monomer; (c) a multifunctional epoxide; and (d) a photoinitiator.

2. A composition according to claim 1 wherein said styrene-maleic anhydride copolymer has less than 5% free anhydride.

3. A composition according to claim 2 wherein at least about 85% of the available anhydride groups of said copolymer are esterified with said hydroxyalkyl (meth)acrylate, and at least about 10% of the available anhydride groups of said copolymer are esterified with said monohydric alcohol.

4. A composition according to claim 1 wherein further comprising an inert solution.

5. A composition according to claim 1 wherein said hydroxyalkyl (meth)acrylate is selected from the group consisting of hydroxyethyl methacrylate, hydroxyethyl acrylate, hydroxypropyl methacrylate, and mixtures thereof.

6. A composition according to claim 5 wherein said hydroxylakyl (meth)acrylate comprises hydroxyethyl methacrylate.

7. A composition according to claim 1 wherein said monohydric alcohol is selected from the group consisting of methanol, propanol, 1-methoxy-2-propanol, butanol, and mixtures thereof.

8. A composition according to claim 7 wherein said monohydric alcohol comprises 1-methoxy-2-propanopl.

9. A composition according to claim 1 wherein said multifunctional (meth)acrylate monomer is selected from the group consisting of polyol polyacrylates, polyol polymethacrylates, and mixtures thereof.

10. A composition according to claim 9 wherein said multifunctional (meth)acrylate comprises trimethylol propane triacrylate.

11. A composition according to claim 1 wherein said multifunctional epoxide is selected from the group consisting of epoxy cresylic novolac resins, epoxidized phenolic novolac resins, and mixtures thereof.

12. A composition according to claim 11 wherein said multifunctional epoxide comprises an epoxy cresylic novolac resin.

13. A method for providing a printed circuit board with a desired patterened distribution of solder mask, comprising the steps of:
 (a) coating a printed circuit board with a radiation-curable composition comprising (1) an esterified styrene-maleic anhydride copolymer having less than 15% free anhydride, and in which at least about 50% of the available anhydride groups are esterified with a hydroxyalkyl (meth)acrylate and at least about 0.1% of the available anhydride groups are esterified with a monohydric alcohol; (2) a multifunctional (meth)acrylate monomer; (3) a multifunctional epoxide; and (4) a photoinitiator;
 (b) drying said coating of radiation-curable composition;
 (c) exposing said coated radiation-curable composition to actinic radiation in said desired pattern to effect imagewise curing of said composition in said desired pattern;
 (d) removing unexposed areas of said coated radiation-curable composition from said printed circuit board thereby leaving on said printed circuit board a distribution of cured composition in said desired pattern; and
 (e) heating said desired patterned distribution of cured composition on said printed circuit board to effect further curing thereof.

14. A process according to claim 13 wherein said desired patterned distribution of cured composition on said printed circuit board is exposed to actinic radiation after step (d) and before step (e).

15. A process according to claim 14 wherein said drying of step (b) is carried out at a temperature in the range of from about 120° F. to about 170° F.

16. A process according to claim 15 wherein said baking of step (e) is carried out at a temperature in the range of from about 250° F. to about 320° F.

17. A process according to claim 16 wherein said removing of unexposed areas according to step (d) comprises contact of said imagewise exposed coated composition with an aqueous alkaline solution.

18. A method according to claim 13 wherein the esterified styrene-maleic anhydride copolymer of the radiation-curable composition of step (a) has less than 5% free anhydride.

19. A method according to claim 18 wherein the esterified styrene-maleic anhydride copolymer of the radiation-curable composition of step (a) has at least about 85% of the available anhydride groups esterified with said hydroxyalkyl (meth)acrylate, and at least about 10% of the available anhydride groups esterified with said monohydric alcohol.

20. A method according to claim 13 wherein said monohydric alcohol with which available anhydride groups of said esterified styrene-maleic anhydride copolymer of the composition of step (a) are esterified is selected from the group consisting of methanol, propanol, 1-methoxy-2-propanol, butanol and mixtures thereof.

* * * * *